United States Patent [19]

Rapata

[11] Patent Number: 4,534,487
[45] Date of Patent: Aug. 13, 1985

[54] BLIND SECUREMENT OF COVER PLATES AND THE LIKE

[76] Inventor: George M. Rapata, 216 Woburn La., Schaumburg, Ill. 60194

[21] Appl. No.: 659,960

[22] Filed: Oct. 11, 1984

[51] Int. Cl.³ .............................................. B65D 51/04
[52] U.S. Cl. ..................................... 220/305; 220/3.8; 220/241; 70/451
[58] Field of Search ............... 220/305, 306, 241, 242, 220/3.8; 70/450, 451

[56] References Cited

U.S. PATENT DOCUMENTS

| 2,997,520 | 8/1961 | Kinsman | 220/242 X |
| 3,015,408 | 1/1962 | Campbell et al. | 220/3.8 X |
| 3,278,066 | 10/1966 | George et al. | 220/241 |
| 4,213,317 | 5/1980 | Ruff . | |

FOREIGN PATENT DOCUMENTS

| 745950 | 5/1933 | France | 220/241 |
| 2286068 | 4/1976 | France | 220/306 |
| 281200 | 1/1931 | Italy | 220/241 |
| 1145786 | 3/1969 | United Kingdom | 220/241 |

Primary Examiner—Steven M. Pollard
Attorney, Agent, or Firm—Trexler, Bushnell & Wolters, Ltd.

[57] ABSTRACT

There is disclosed an assembly comprising a workpiece panel having an opening, a cover plate for the opening and blind securement means including resiliently interengageable elements on the panel and the cover plate constructed for enabling the cover plate to be assembled from the outside of the panel and to permit initial insertion through the opening without substantial interference between the interengageable elements.

13 Claims, 17 Drawing Figures

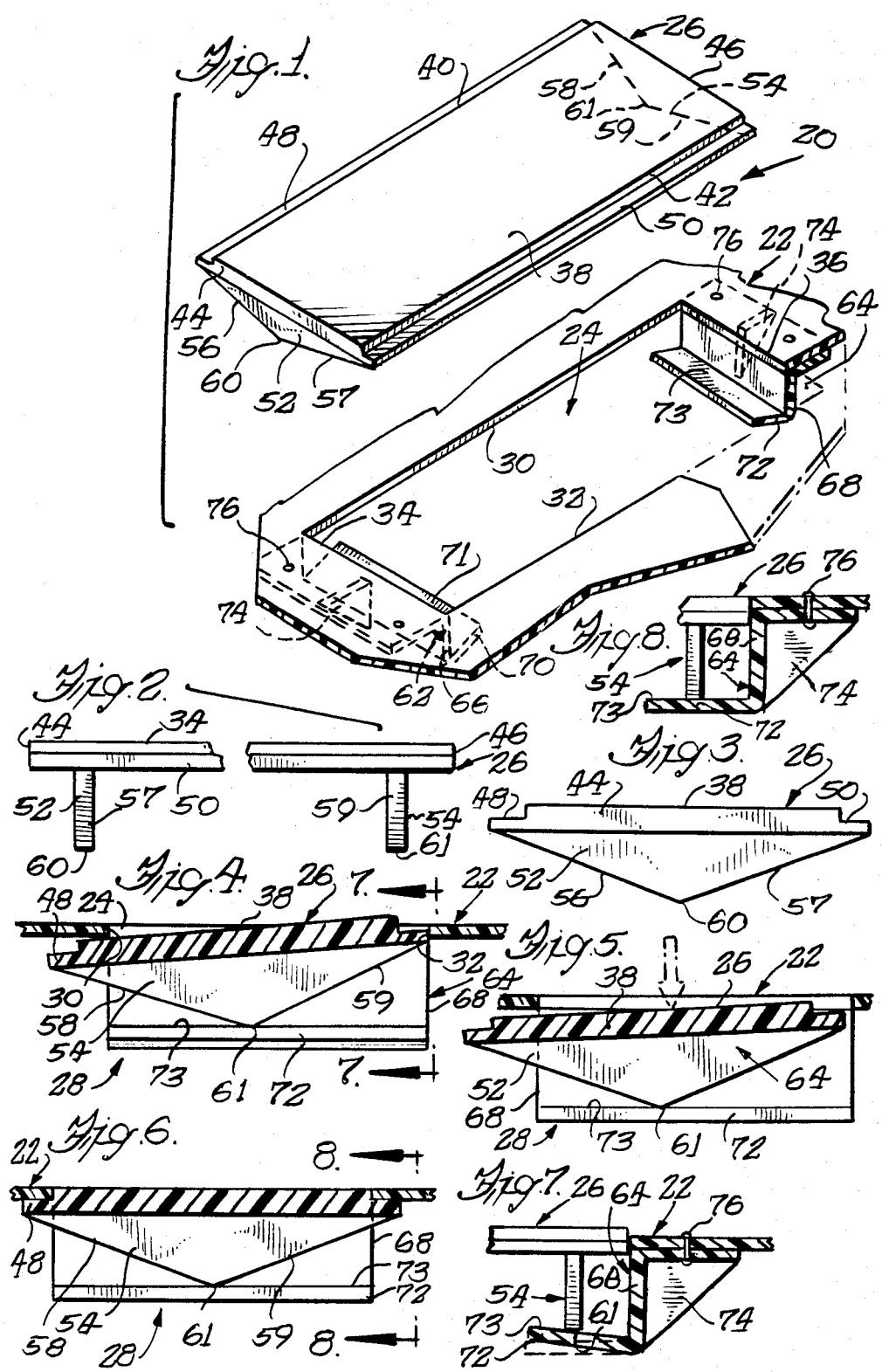

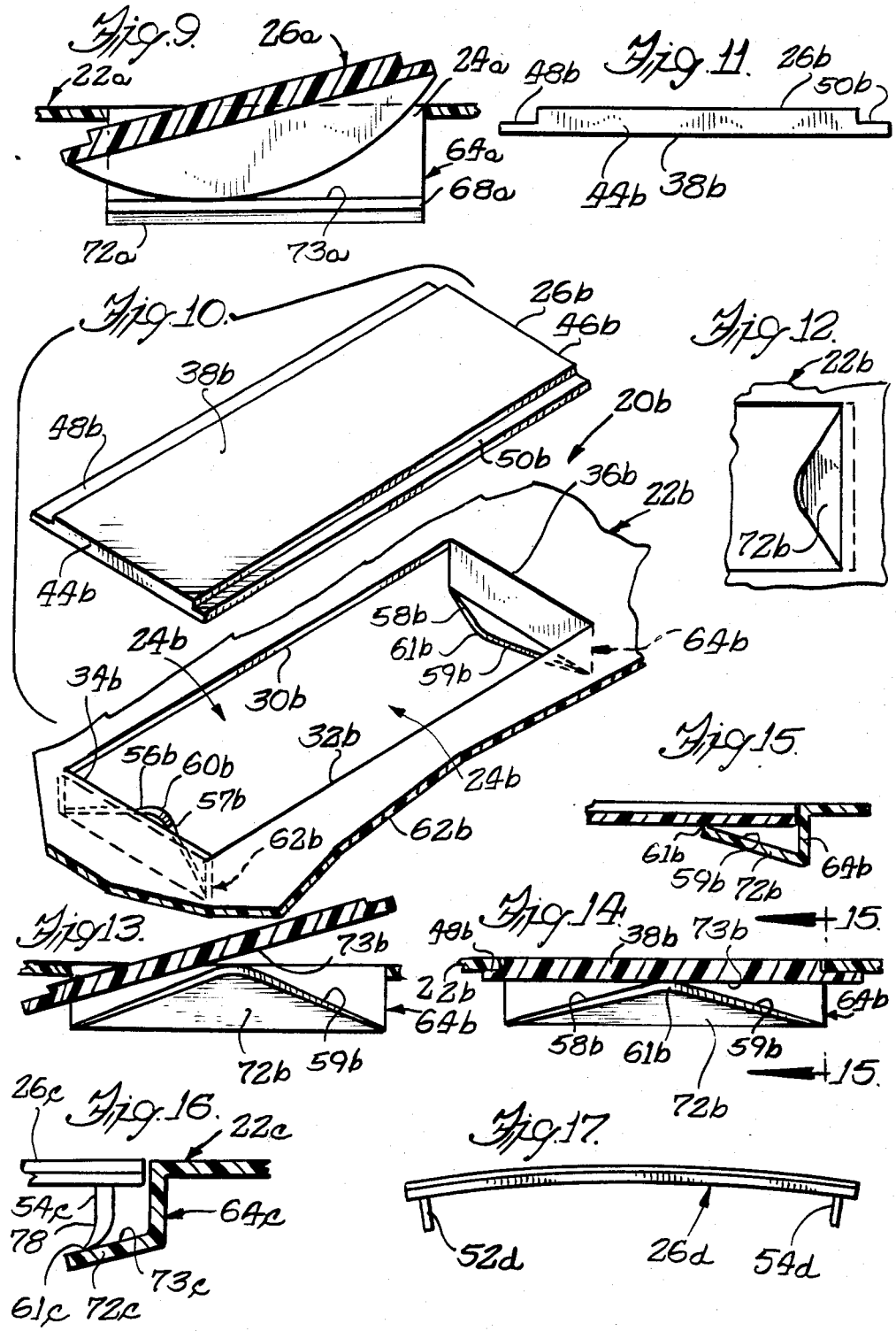

BLIND SECUREMENT OF COVER PLATES AND THE LIKE

BACKGROUND OF THE INVENTION

The present invention relates to the securement of cover plates, access plates, inserts and the like in openings in a panel or other workpiece, and more particularly to the blind securement of such cover plates and the like.

There are many instances where it is desired to secure cover plates and the like in openings in a panel or other workpiece. For example, a variety of electronic housings frequently include cover or access panels which must be secured in place, interchangeable name plates are frequently desired for many pieces of equipment, and speaker grills or recessed light covers need to be secured in position.

Various means have been suggested for securing such cover plates and the like in position. Some of such securement means have required separate fasteners such as screws and others have necessitated some portion of the cover plate or the fastener to be exposed above the surface of the panel or like with which the cover plate is to be mounted.

OBJECTS AND SUMMARY OF THE INVENTION

It is an object of the present invention to provide a novel securement for cover plates and the like and more particularly to provide for the blind securement of such cover plates in a manner such that the securement means is completely hidden and such that the cover plate may be easily and quickly assembled from the exterior of the apertured panel or the like and in a manner so that the surface of the cover plate, if desired, may be made flush with the surface of the panel.

A more specific object of the present invention is to provide a novel, simple and economical securement for a cover plate or the like whereby said cover plate may be easily installed from the exterior of an apertured panel or similar workpiece and resiliently clamped in position.

A still more specific object of the present invention is to provide novel securement means of the above-described type for a cover plate constructed so as to enable the cover plate to be inserted from the exterior of an apertured panel or the like through the aperture without compressing or activating resilient elements of the securement means and further constructed so that such resilient elements will become effective for resiliently but firmly securing the cover plate when the cover plate has been moved substantially to its fully assembled position within the panel aperture.

THE DRAWINGS

Other objects and advantages of the present invention will become apparent from the following description and the accompanying drawings wherein:

FIG. 1 is an exploded perspective view showing an apertured panel, a cover plate and securement means therefor incorporating features of the present invention;

FIG. 2 is a side elevational view showing the cover plate of FIG. 1 incorporating features of the present invention;

FIG. 3 is an end elevational view of the cover plate shown in FIGS. 1 and 2;

FIG. 4 is a simplified partial sectional view showing an initial step of inserting or assembling the cover plate of FIG. 1 through an aperture in the workpiece or panel;

FIG. 5 is similar to FIG. 4 but shows the cover plate in an intermediate condition of assembly;

FIG. 6 is similar to FIGS. 4 and 5 but shows the cover plate fully assembled within the panel or workpiece aperture;

FIG. 7 is a fragmentary sectional view taken generally along the line 7—7 in FIG. 4;

FIG. 8 is a fragmentary sectional view taken generally along the line 8—8 in FIG. 6;

FIG. 9 is a fragmentary partial sectional view similar to FIG. 4 but shows a slightly modified form of the present invention;

FIG. 10 is an exploded perspective view similar to FIG. 1 showing a modified form of the present invention;

FIG. 11 is an end view of the cover plate shown in FIG. 10;

FIG. 12 is a fragmentary plan view showing a portion of the apertured panel or workpiece and cover plate securement means of FIG. 10;

FIG. 13 is a fragmentary partial sectional view similar to FIG. 4 and showing the initial step for assembling the cover plate of FIG. 10 through the workpiece or panel aperture;

FIG. 14 is a partial fragmentary sectional view showing the cover plate of FIGS. 10-13 fully assembled;

FIG. 15 is a fragmentary sectional view taken along the line 15—15 in FIG. 14;

FIG. 16 is a fragmentary sectional view similar to FIG. 8 but shows a modified form of the present invention; and FIG. 17 is a side elevational view of a cover plate similar to FIG. 2 but shows a slightly modified form of the present invention.

DETAILED DESCRIPTION OF THE ILLUSTRATED EMBODIMENTS

Referring now more specifically to the drawings wherein like parts are designated throughout the various figures by the same numerals, an assembly 20 incorporating features of the present invention is shown in FIG. 1 and comprises a workpiece or panel 22 having an opening or aperture 24 therein and a cover plate 26 adapted to cover the aperture 24. Securement means indicated by the reference numeral 28 in FIGS. 4-6 is provided for securely retaining the cover plate within the aperture 24 when the cover plate is finally assembled. As will be described in more detail below, this securement means comprises elements and surfaces on both the workpiece or panel 22 and the cover plate 26.

In the embodiment shown for the purpose of illustrating the present invention, the workpiece or panel 22 may, for example, be a part of an electronic housing or cabinet, a light fixture, an instrument panel, a control panel, a battery box, a loud speaker grill, an automobile fender surrounding a side marker lamp and many other assemblies which may suggest themselves. While in the embodiment shown, the aperture or opening 24 through the panel 22 is disclosed as being rectangular and defined by opposite side edges 30, 32 and opposite end edges 34, 36, it is to be understood that the shape of the opening can be modified. For example, the opening 24 may have one or more curved margins, or it may be oval or round or trapezoidal or have combinations of these shapes.

The cover plate 26 of this embodiment of the invention has a main body 38 shaped to conform to the configuration of the opening 24. Thus in the embodiment shown, the body 38 has opposite side edges 40, 42 and opposite end edges 44 and 46 corresponding in dimensions and configuration to the edges 30–36 of the opening 24. The cover plate 26 may be made from any suitable material such as plastic, metal or glass and for many applications may be conveniently and economically molded from a tough durable plastic material such as polypropylene or nylon.

In the embodiment of the invention shown, the cover plate body 38 is preferably formed so that its outer surface will be coplanar with the outer surface of the panel or workpiece 22 when the cover plate is fully assembled. Thus the cover plate 26 is provided with elements or portions constituting a part of the securement means 28 as will be described below, which elements are located beneath the outer surface of the body 38 so as not to be exposed when the cover plate is finally assembled. In this embodiment, such elements of the securement means on the cover plate 26 comprise flanges or shoulders 48 and 50 extending laterally from opposite side edges 40 and 42 of the body 38 and adapted to engage margins of the panel or workpiece aperture beneath the edges 30 and 32 when the cover plate is assembled for resisting outward movement of the cover plate and retaining it within the workpiece aperture or opening. It will be noted that the body 38 of the cover plate has a thickness greater than the thickness of the panel or workpiece 22 so that when the cover plate is fully assembled as shown in FIG. 6 with the shoulders or flanges 48 and 50 projecting beneath the opposite side edges of the panels, the outer surface of the body 38 will be coplanar with the outer surface of the panel 22.

The elements of the securement means on the cover plate 26 of this embodiment also include depending flange-like portions 52 and 54 adjacent opposite end edges 44 and 46 respectively and presenting bottom cam or abutment surfaces 56, 57, and 58, 59. In this embodiment, the flange portions 52 and 54 have an inverted triangular configuration so that the cam or abutment surfaces 56, 57, and 58, 59 are respectively angularly disposed substantially straight sides meeting at low points or apexes 60 and 61 for the purpose described below.

As previously indicated, the panel or workpiece 22 carries elements forming a part of the securement means 28, which elements are complementary to and cooperable with elements of a securement means on the cover plate 26. More specifically, generally oppositely disposed L-shaped members 62 and 64 depend from opposite end edges 34 and 36 of the workpiece opening. These L-shaped members respectively include vertical leg portions 66 and 68 and laterally extending ledge portions 70 and 72 presenting upwardly facing abutment or cam surfaces 71 and 73.

In this embodiment, the depending L-shaped members are formed as parts separate from the panel or workpiece 22. As indicated in FIGS. 1, 7 and 8, these L-shaped members may be secured to the panel member 22 by suitable fasteners 76. Alternatively, these L-shaped members can be adhesively secured to the panel or formed integrally with the panel. The L-shaped members are made from a material which is tough and stiff enough for its intended purpose, but which at the same time has a desired degree of resiliency. Various spring metals or resilient plastic materials such as polypropylene or nylon may be utilized.

The horizontal ledge portions 70 and 72 are positioned so that their upper cam surfaces 71 and 73 are normally spaced beneath the undersurface of the panel 22 a distance which is less than the vertical spacing of the cam surface apexes 60 and 62 from the upper surfaces of the lips or flanges 48 and 50 of the cover plate. Thus when the cover plate is assembled with the panel in the manner described below, the cam surfaces 56 and 58 on the cover plate will interfere with the upper cam surfaces on the horizontal ledge members 70, 72 in a manner causing the L-shaped members 62 and 64 of the securement means and particularly the ledge portions 70 and 72 thereof to be deflected from their normal positions. The inherent resiliency of the material from which the panel and thus the L-shaped members 62 and 64 are formed provides a spring action which will firmly and securely retain the cover plate in its final assembled position as will be described below.

The manner in which the cover plate 26 may be assembled with the panel or workpiece 22 is shown in FIGS. 4, 5 and 6. Referring first to FIG. 4, it is seen that the formation of the triangular cam or abutment surfaces 56, 57, and 58, 59 on the cover plate is such that the vertical spacing from the upper surfaces of the cover plate body adjacent the flanges 48 and 50 is relatively small and much less than the spacing between the upper surface of the horizontal member 70 and the under surface of the panel 22. As a result, the initial step of inserting one margin of the cover plate through the opening 24 as shown in FIG. 4, may be easily accomplished without substantial interference between the complementary cam or abutment surfaces on the cover plate and on the horizontal ledge sections 70 and 72 and without the necessity of any significant deflection of the ledge sections or the L-shaped members.

After the initial step of the assembly has been completed as shown in FIG. 4 with the margin of the body 38 adjacent the lip or flange 48 inserted sufficiently beneath the panel to permit the opposite flange 50 to clear the opposite edge of the panel opening, the next step is to apply pressure to the cover plate adjacent the flange 50. This action will cause the cover plate to pivot around the apexes 60 and 62 of the cam surfaces until the upper surface of the main body 38 engages beneath the panel 22 as shown in FIG. 5. Further application of pressure will cause the L-shaped spring members 62 and 64, and particularly the horizontal portions 70 and 72 thereof, to be deflected downwardly as shown in FIG. 5 until the marginal flange 50 of the cover plate has been lowered sufficiently to clear the edge of the panel opening. Finally, the cover plate may be easily slid toward the right as viewed in FIG. 6 to a position in which the flange 50 engages beneath the margin of the panel opening and the margin of the body adjacent the flange 48 clears the opposite panel edge so that it may assume the final assembled position with its outer surface flush with the panel surface. The interengagement of the flanges 48 and 50 with the underside of the panel in cooperation with the resilient clamping pressure provided through the spring elements 62 and 64 and particularly the horizontal portions 70 and 72 thereof bearing against the cam surfaces 56, 57 and 58, 59 on the cover plate cause the cover plate to be securely fixed in the assembly. If desired the cover plate may be removed from the opening simply by reversing the process shown in FIGS. 4, 5 and 6.

In the embodiment shown, the horizontal ledge portions 70 and 72 of the L-shaped spring elememts are inclined upwardly in their normal unstressed condition. This arrangement permits the size of the depending elements 52 and 54 on the cover plate to be minimized, but if desired the ledge portions 70 and 72 could initially be either exactly horizontal or even inclined downward. In FIGS. 1, 7 and 8, there is shown a fillet or gusset 74 between the underside of the panel 22 and the depending or vertical leg portions of the L-shaped members. Such gussets which may be optionally provided for both of the L-shaped members 62 and 64 and serve to reinforce the vertical portions of the L-shaped members and for restricting the resilient spring action primarily to the horizontal ledge portions.

FIG. 9 shows a slightly modified form of the present invention which is essentially identical to the structure described above as indicated by the application of identical reference numerals with the suffix a added to corresponding parts. This embodiment differs in that the cam surfaces on the depending elements of the cover plate are provided with an arcuate configuration rather than the triangular configuration of the previous embodiment.

Referring now to FIGS. 10 through 15, there is shown another modified form of the present invention similar to the structures described above as indicated by the application of identical reference numerals with the suffix b added to corresponding elements. This embodiment differs primarily in the location of the cooperating cam surfaces on the cover plate 26b and the horizontal portions 70b and 72b of the L-shaped members 62b and 64b. More specifically in the embodiment shown in FIGS. 1 through 9, the securement means cam surfaces on the cover plate have a generally triangular or arcuate configuration while the cooperating cam surfaces on the horizontal portions 70, 72 are substantially flat. This arrangement is reversed in the embodiment of FIGS. 10-15 wherein the horizontal portions 70b and 72b respectively present triangularly disposed cam or abutment surfaces 56b, 57b meeting at apex 60b and cam or abutment surfaces 58b, 59b meeting at apex 61b.

Furthermore, the laterally extending or generally horizontal portions 70b and 72b are normally inclined upwardly so that their apexes 60b and 61b are normally located near or even above the plane of the outer surface of the panel 22b as shown best in FIG. 13. Thus the relationship between the cooperating flat cam surfaces and triangularly disposed cam surfaces on the cover plate and L-shaped members is again such that the cover plate may be inserted into the opening during an initial step of assembly as indicated in FIG. 13 without significantly displacing or compressing the resilient clamping means. At the same time, the arrangement is such that when the cover plate is fully assembled as shown in FIG. 14 and FIG. 15, the laterally or generally horizontally extending spring elements 70b and 72b are again flexed sufficiently for firmly clamping the cover plate in the assembled position.

It is also noted that the embodiment of FIGS. 10-15 illustrates the manner in which the L-shaped spring members of the securement means may, if desired, be formed integral with the panel 22b. Of course, the L-shaped members of the embodiment of FIG. 10 could also be formed as separate members as indicated in the embodiment of FIG. 1.

FIG. 16 shows a further modification of the present invention similar to the embodiments shown in FIGS. 1-9 as indicated by the application of identical reference numerals with the suffix c added to corresponding elements. In this embodiment, the depending flanges or cam members on the cover plate (only cam member 54c being shown) have progressively thinned or tapered lower marginal portions 78. The flange or cam member 54c and the corresponding flange at the other end of the cover plate (not shown) are formed from a tough resiliently flexible material such as polypropylene or nylon. The inherent resiliency of this material coupled with the tapering of the marginal portion 78 is such that the marginal portions will flex as shown in FIG. 16 when the cover plate is fully assembled and thus provide a spring action in addition to the spring action of the lateral or generally horizontal spring portion 72c for securely holding the cover plate in position.

FIG. 17 shows a cover plate 26d embodying still another modification of the present invention. In this embodiment, elements of the cover plate corresponding to those described above are indicated by the application of identical reference numerals with the suffix d added. The cover plate 26d differs in that it has an arched configuration from end to end. Thus when the cover plate is fully assembled with an apertured panel or workpiece, the portion of the cover plate body between the cam members 52d and 54d will be flexed and straightened and the inherent resiliency of the plastic or other material from which the cover plate is formed will aid in maintaining central portions of the cover plate in coplanar relationship with the panel 22. This arched configuration could be incorporated in any of the cover plates described above, if desired.

While preferred embodiments of the present invention have been shown and described herein, many modifications may suggest themselves without departing from the spirit and scope of the appended claims. It is to be noted that the term cover plate used herein throughout the specification and claims is intended to refer not only to plates which simply cover an opening or aperture, but also to such devices as access panels, loudspeaker grills, nameplates, light fixture lenses and the like.

The invention is claimed as follows:

1. An assembly of the type described comprising a workpiece having an opening defined in part by spaced apart opposite marginal portions, a cover plate for said opening, and blind securement means for securing the cover plate within said opening, said cover plate being insertable through said opening for assembly, said securement means including shoulder means at opposite sides of said cover plate respectively engageable beneath said opposite marginal portions when the cover plate is fully assembled, said securement means further comprising first cover plate cam surface means and second workpiece cam surface means disposed for cooperative engagement with each other, means resiliently supporting at least one of said cam surface means for enabling the cover plate and one side shoulder means to be initially inserted through said opening and beneath one of said margins sufficiently to enable the opposite side shoulder means to clear the other of said margins portions without substantially displacing said one cam surface means and for yielding upon depression of the cover plate sufficiently to move said other side shoulder means beneath said other marginal portion and for subsequently resiliently clamping said opposite side shoulder means beneath said opposite marginal portions.

2. An assembly, as defined in claim 1, wherein said means resiliently supporting said one cam surface means is connected with said workpiece and supports said second workpiece cam surface means.

3. An assembly, as defined in claim 2, wherein said means resiliently supporting said second workpiece cam surface means comprises an L-shaped member of resilient material including a laterally projecting portion, said second workpiece cam surface means being on said laterally projecting portion.

4. An assembly, as defined in claim 3, wherein said second workpiece cam surface means is substantially flat and said first cam surface means has a central apex and portions inclined from said apex toward said shoulder means at opposite sides of the cover plate.

5. An assembly, as defined in claim 4, wherein said inclined cam surface portions are generally straight.

6. An assembly, as defined in claim 4, wherein said inclined cam surface portions are arcuate.

7. An assembly, as defined in claim 3, wherein said cover plate cam surface means is substantially flat, said second workpiece cam surface means on said laterally projecting portion having an apex relatively adjacent the plane of the workpiece and inclined portions extending from said apex and away from the workpiece.

8. An assembly, as defined in claim 2, which includes means resiliently supporting said cover plate cam surface means for yieldable displacement during final assembly of the cover plate with the workpiece for complementing said means resiliently supporting the workpiece cam surface means for resiliently clamping the cover plate in the assembly.

9. An assembly, as defined in claim 1, wherein said first and second cam surface means are located toward opposite ends of the cover plate, said cover plate being arched between said opposite ends for aggressively positioning central portions of the cover plate within the workpiece opening when the cover plate is fully assembled.

10. An assembly of the type described comprising a workpiece having an opening of predetermined configuration therein at least partially defined by marginal portions, a cover plate having a body portion with a configuration complementary to said opening configuration, said body portion being insertable through the opening from the outside of the workpiece during assembly, and securement means for securing said cover plate within said opening, said securement means comprising shoulders projecting outwardly of margins of said cover plate body portion for engagement beneath said marginal portions of the workpiece after the cover plate has been fully assembled with the workpiece, said securement means further including a generally L-shaped member of resilient material extending inwardly of said workpiece opening and including a resiliently yieldable laterally extending section presenting generally upwardly facing abutment surface means, downwardly facing abutment surface means on said cover plate positioned for cooperative engagement with said upwardly facing surface means, one of said surface means including an apex portion positioned for causing said laterally extending section to be resiliently displaced when the cover plate is fully assembled with said shoulders engaging beneath said marginal portions, and said abutment surfaces being positioned for enabling one margin of said cover plate to be inserted through said opening and beneath one of said marginal portions of the workpiece during an initial assembly step without sufficient interference between said surfaces to cause displacement of said laterally extending section for facilitating such initial assembly step.

11. An assembly as defined in claim 10 wherein said L-shape member is integral with said workpiece.

12. An assembly as defined in claim 10 wherein said L-shape member is separate from and secured to said workpiece.

13. An assembly as defined in claim 10 wherein said opening and said cover plate body portion are rectangular, said cover plate comprising a pair of said shoulders extending along opposite side edges of the body portion for engagement beneath opposite side marginal portions of said opening, said securement means comprising a pair of said L-shape members respectively disposed adjacent opposite ends of said opening, said securement means further comprising a pair of said downwardly facing abutment surface means adjacent opposite ends of the cover plate respectively for engagement with the upwardly facing surface means on an adjacent one of said L-shape members.

* * * * *